United States Patent
Jiang et al.

(10) Patent No.: US 10,319,781 B2
(45) Date of Patent: Jun. 11, 2019

(54) DISPLAY SUBSTRATE, ITS MANUFACTURING METHOD AND DISPLAY DEVICE

(71) Applicant: BOE TECHNOLOGY GROUP CO., LTD., Beijing (CN)

(72) Inventors: Feng Jiang, Beijing (CN); Li Zhou, Beijing (CN); Long Wang, Beijing (CN); Xingdong Liu, Beijing (CN); Chungchun Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 228 days.

(21) Appl. No.: 15/139,092

(22) Filed: Apr. 26, 2016

(65) Prior Publication Data

US 2016/0336374 A1    Nov. 17, 2016

(30) Foreign Application Priority Data

May 15, 2015    (CN) .......................... 2015 1 0249624

(51) Int. Cl.
*H01L 27/00* (2006.01)
*H01L 27/15* (2006.01)
(Continued)

(52) U.S. Cl.
CPC ........ *H01L 27/156* (2013.01); *H01L 27/1222* (2013.01); *H01L 27/1248* (2013.01);
(Continued)

(58) Field of Classification Search
CPC ............... H01L 27/156; H01L 27/1222; H01L 27/1248; H01L 27/1259; H01L 29/66765;
(Continued)

(56) References Cited

U.S. PATENT DOCUMENTS 6,524,971 B1 *  2/2003  Fetter ................... C23C 14/0617
                                                         257/E21.09
2009/0078943 A1    3/2009  Ishida et al.
(Continued)

FOREIGN PATENT DOCUMENTS

CN    101924020 A    12/2010
CN    103247651 A    8/2013
CN    104600081 A    5/2015

OTHER PUBLICATIONS

First Office Action regarding Chinese Application No. 201510249624.1, dated Jun. 1, 2017. Translation provided by Dragon Intellectual Property Law Firm.

*Primary Examiner* — Mounir S Amer
*Assistant Examiner* — Alexander Belousov
(74) *Attorney, Agent, or Firm* — Harness, Dickey & Pierce, P.L.C.

(57) ABSTRACT

The present disclosure provides a display substrate, its manufacturing method, and a display device. The method includes a step of forming a plurality of TFTs. The method further includes steps of: forming a lattice matching layer on a substrate so as to deposit AlN thereon; depositing an AlN layer on the lattice matching layer by low-temperature pulse magnetron sputtering; and forming on the AlN layer GaN LEDs each including an n-type GaN layer, a multilayered quantum well structure and a p-type GaN layer and corresponding to one of the TFTs.

15 Claims, 14 Drawing Sheets

(51) Int. Cl.
*H01L 27/12* (2006.01)
*H01L 29/786* (2006.01)
*H01L 29/66* (2006.01)
*H01L 33/32* (2010.01)
*H01L 33/00* (2010.01)

(52) U.S. Cl.
CPC .... *H01L 27/1259* (2013.01); *H01L 29/66765* (2013.01); *H01L 29/78678* (2013.01); *H01L 33/0066* (2013.01); *H01L 33/32* (2013.01)

(58) Field of Classification Search
CPC ................. H01L 29/78678; H01L 33/0066; H01L 33/32
See application file for complete search history.

(56) References Cited

U.S. PATENT DOCUMENTS

| 2010/0314627 | A1* | 12/2010 | Sung | H01L 21/02376 257/77 |
| 2013/0207071 | A1* | 8/2013 | Fong | H01L 27/156 257/13 |
| 2014/0070169 | A1* | 3/2014 | Zhou | H01L 27/3274 257/29 |
| 2016/0359054 | A1 | 12/2016 | Fang et al. | |

* cited by examiner

DISPLAY SUBSTRATE, ITS MANUFACTURING METHOD AND DISPLAY DEVICE

CROSS-REFERENCE TO RELATED APPLICATION

The present application claims a priority of the Chinese patent application No. 201510249624.1 filed on May 15, 2015, which is incorporated herein by reference in its entirety.

TECHNICAL FIELD

The present disclosure relates to the field of display technology, in particular to a display substrate, its manufacturing method and a display device.

BACKGROUND

A conventional gallium nitride (GaN) Light-Emitting Diode (LED) is manufactured on a silicon substrate or sapphire substrate with an atomic-level flatness by epitaxial growth or chemical vapor deposition. However, there are the following drawbacks for this manufacture process. The silicon substrate or sapphire substrate is expensive and of a relatively small size. As a result, a resultant display using the GaN LED is of a limited size and a relatively high cost. Hence, there is an urgent need to manufacture the GaN LED on a cheap and large-size substrate (e.g., a glass substrate).

SUMMARY

An object of the present disclosure is to provide a display substrate, its manufacturing method and a display device, so as to manufacture the GaN LED on a large-size substrate.

In one aspect, the present disclosure provides in some embodiments a method for manufacturing a display substrate, including a step of forming a plurality of thin film transistors (TFTs). The method further includes steps of: forming a lattice matching layer on a substrate so as to deposit thereon aluminium nitride (AlN); depositing an AlN layer on the lattice matching layer by low-temperature pulse magnetron sputtering; and forming on the AlN layer GaN LEDs each including an n-type GaN layer, a multilayered quantum well structure and a p-type GaN layer and corresponding to one of the TFTs.

Alternatively, the lattice matching layer is a graphene layer.

Alternatively, prior to the step of depositing the AlN layer on the lattice matching layer by low-temperature pulse magnetron sputtering, the method further includes subjecting the graphene layer to heat treatment in vacuum or nitrogen at a temperature of 500 to 600° C.

Alternatively, the method includes steps of: providing a base substrate; forming a TFT including a gate electrode, a source electrode and a drain electrode on the base substrate; forming a passivation layer having a surface roughness not greater than a predetermined value on the base substrate with the TFT; forming a graphene layer including a first via-hole on the passivation layer; depositing an AlN layer on the graphene layer by low-temperature pulse magnetron sputtering; forming an n-type GaN layer on the AlN layer, and forming a second via-hole penetrating through the passivation layer, the AlN layer and the n-type GaN layer and located in the first via-hole; forming a via-hole electrode configured to connect the n-type GaN layer to the drain electrode through the second via-hole; and forming a pixel definition layer, a multilayered quantum well structure, a p-type GaN layer and a transparent electrode layer.

Alternatively, the step of forming the graphene layer including a first via-hole on the passivation layer includes: depositing single-layered or multilayered graphene on a copper foil, laminating the graphene layer on the copper foil onto the base substrate with the passivation layer so as to attach the graphene layer onto the passivation layer, and etching off the copper foil by an etchant, so as to form the graphene layer including the first via-hole by plasma etching; or depositing single-layered or multilayered graphene onto the copper foil, patterning the graphene layer by plasma etching, and transferring the patterned graphene layer onto the base substrate with the passivation layer, so as to form the graphene layer including the first via-hole on the passivation layer; or etching the copper foil with an etchant to pattern the copper foil, depositing single-layered or multilayered graphene onto the patterned copper foil, and transferring the graphene layer on the patterned copper foil onto the base substrate with the passivation layer, so as to form the graphene layer including the first via-hole on the passivation layer.

Alternatively, the method includes steps of: providing a base substrate; depositing a first transparent conductive layer on the base substrate; forming a graphene layer on the first transparent conductive layer; depositing an AlN layer onto the graphene layer by low-temperature pulse magnetron sputtering; forming an n-type GaN layer, a pixel definition layer, a multilayered quantum well structure, a p-type GaN layer and a second transparent conductive layer sequentially on the AlN layer; etching the pixel definition layer, the multilayered quantum well structure, the p-type GaN layer and the second transparent conductive layer at a channel region, so as to expose the n-type GaN layer at the channel region; etching the n-type GaN layer, the AlN layer and the graphene layer at the channel region, so as to form a first electrode hole penetrating through the n-type GaN layer, the AlN layer and the graphene layer; forming a first electrode configured to connect the n-type GaN layer to the first transparent conductive layer through the first electrode hole; forming a planarization layer, and forming the TFT including a gate electrode, a gate insulation layer, a source electrode and a drain electrode on the planarization layer; forming a second electrode hole penetrating through the gate insulation layer and the planarization layer; forming a second electrode configured to connect the p-type GaN layer to the drain electrode through the second electrode hole; and forming a passivation layer.

Alternatively, the step of forming the graphene layer on the first transparent conductive layer includes: depositing single-layered or multilayered graphene onto a copper foil, laminating the graphene layer on the copper foil onto the base substrate with the first transparent conductive layer so as to attach the graphene layer onto the first transparent conductive layer, and etching off the copper foil by an etchant; or depositing single-layered or multilayered graphene onto the copper foil, and transferring the graphene layer onto the base substrate with the first transparent conductive layer, so as to form the graphene layer on the first transparent conductive layer.

Alternatively, the step of depositing the AlN layer on the lattice matching layer by low-temperature pulse magnetron sputtering includes sputtering an Al target with a bipolar pulse in a working gas at a temperature of 500 to 600° C. and at a pressure of 0.3 to 0.6 Pa, so as to form the AlN layer having a thickness of 30 to 100 nm. The pulse has a frequency of 10 to 100 kHz, a duration of an on-state signal is $\frac{1}{10}$ to $\frac{1}{2}$ of a duration of an off-state signal, the working gas is a mixture of $N_2$ or $NH_3$ and Ar, and a deposition rate is 500 to 3000 nm/h.

Alternatively, the step of forming the n-type GaN layer includes forming the n-type GaN having a thickness of 1000 to 1500 nm on the AlN layer through a first mask plate by low-temperature pulse magnetron sputtering. The first mask plate includes an aperture corresponding to a region where the n-type GaN layer is deposited, and a target is Ga doped with Si or O.

Alternatively, the step of forming the multilayered quantum well structure includes sequentially depositing a GaN layer having a thickness of 8 to 10 nm and an indium gallium nitride (InGaN) layer having a thickness of 3 to 5 nm on the n-type GaN layer using undoped Ga and In-doped Ga as targets through a second mask plate by low-temperature pulse magnetron sputtering, and repeating the deposition procedure five times, so as to form the multilayered quantum well structure. The second mask plate includes an aperture corresponding to a region where the multilayered quantum well structure is deposited.

Alternatively, the step of forming the p-type GaN layer includes forming the p-type GaN layer having a thickness of 500 to 800 nm on the multilayered quantum well structure through a third mask plate by low-temperature pulse magnetron sputtering. The third mask plate includes an aperture corresponding to a region where the p-type GaN layer is deposited, and a target is Mg-doped Ga.

In another aspect, the present disclosure provides in some embodiments a display substrate including a plurality of TFTs. The display substrate further includes: a lattice matching layer; an AlN layer formed on the lattice matching layer; and GaN LEDs formed on the AlN layer and each including an n-type GaN layer, a multilayered quantum well structure and a p-type GaN layer and corresponding to one of the TFTs.

Alternatively, the lattice matching layer is a graphene layer.

Alternatively, the display substrate includes: a base substrate; the TFT formed on the base substrate and including a gate electrode, a source electrode and a drain electrode; a passivation layer formed on the base substrate with the TFT and having a surface roughness not greater than a predetermined value; the graphene layer formed on the passivation layer and including a first via-hole; the AlN layer formed on the graphene layer; the n-type GaN layer formed on the AlN layer, and a second via-hole penetrating through the passivation layer, the AlN layer and the n-type GaN layer and located within the first via-hole; a via-hole electrode configured to connect the n-type GaN layer to the drain electrode through the second via-hole; and a pixel definition layer, the multilayered quantum well structure, the p-type GaN layer and a transparent electrode layer formed on the base substrate with the via-hole electrode.

Alternatively, the display substrate includes: a base substrate; a first transparent conductive layer formed on the base substrate; the graphene layer formed on the first transparent conductive layer; the AlN layer formed on the graphene layer; an n-type GaN layer, a pixel definition layer, the multilayered quantum well structure, the p-type GaN layer and a second transparent conductive layer formed on the AlN layer, and a first electrode hole penetrating through the n-type GaN layer, the AlN layer and the graphene layer; a first electrode configured to connect the n-type GaN layer to the first transparent conductive layer through the first electrode hole; a planarization layer formed on the base substrate with the first electrode; the TFT formed on the planarization layer and including a gate electrode, a gate insulation layer, a source electrode and a drain electrode; a second electrode hole penetrating through the gate insulation layer and the planarization layer; a second electrode configured to connect the p-type GaN layer to the drain electrode through the second electrode hole; and a passivation layer formed on the base substrate with the second electrode.

Alternatively, the base substrate is a glass substrate.

In yet another aspect, the present disclosure provides in some embodiments a display device including the above-mentioned display substrate.

According to the embodiments of the present disclosure, the lattice matching layer including atoms arranged regularly and densely is formed on the base substrate, then the high-quality AlN layer is formed on the lattice matching layer by low-temperature pulse magnetron sputtering, and then the GaN LED including the n-type GaN layer, the multilayered quantum well structure and the p-type GaN layer is formed on the AlN layer. As a result, it is able to form the GaN LED on a large-size substrate.

DETAILED DESCRIPTION OF THE EMBODIMENTS

Figure 1:
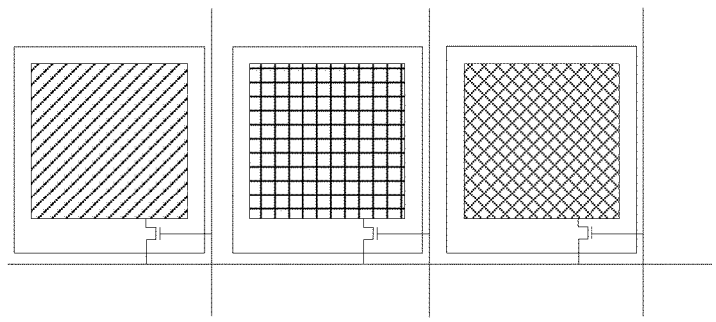
FIG. 1 is a plan view of a display substrate according to one embodiment of the present disclosure.

In order to make the objects, the technical solutions and the advantages of the present disclosure more apparent, the present disclosure will be described hereinafter in a clear and complete manner in conjunction with the drawings and embodiments.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

A nitride layer needs to be epitaxially grown or deposited by chemical vapor deposition on at a high temperature of about 1000° C., and a property of a glass substrate may be adversely affected by such a high temperature. Hence, it is impossible to manufacture GaN LEDs on a large-size glass substrate by epitaxially growing the nitride layer or depositing the nitride layer by chemical vapor deposition. In order to manufacture the GaN LEDs on the large-size substrate, in the related art, the nitride layer desired for the manufacture of the GaN LEDs is deposited by direct current magnetron sputtering, but a result of this process is not ideal. A main problem existing in this process lies in that it is very difficult to form a high-quality monocrystalline nitride by sputtering. In order to form the high-quality monocrystalline nitride, a film having a crystal structure similar to the deposited nitride may be formed at first on a substrate so as to form the base substrate, and usually the film is made of AlN, ZnO or $Al_2O_3$. However, it is easy to deposit the film onto a silicon substrate or a sapphire substrate, while it is very difficult to deposit the film onto a glass substrate to obtain the high-quality base substrate.

The present disclosure provides in some embodiments a display substrate, its manufacture method and a display device so as to manufacture the GaN LEDs on a cheap and large-size substrate (e.g., the glass substrate).

The present disclosure provides in some embodiments a method for manufacturing a display substrate, including a step of forming a plurality of thin film transistors (TFTs). The method further includes steps of: forming a lattice matching layer on a substrate so as to deposit thereon AlN; depositing an AlN layer on the lattice matching layer by low-temperature pulse magnetron sputtering; and forming on the AlN layer GaN LEDs each including an n-type GaN layer, a multilayered quantum well structure and a p-type GaN layer and corresponding to one of the TFTs.

According to the method in the embodiments of the present disclosure, the lattice matching layer including atoms arranged regularly and densely is formed on the base substrate, then the high-quality AlN layer is formed on the lattice matching layer by low-temperature pulse magnetron sputtering, and then the GaN LED including the n-type GaN layer, the multilayered quantum well structure and the p-type GaN layer is formed on the AlN layer. As a result, it is able to form the GaN LED on a large-size substrate.

To be specific, the lattice matching layer may be a graphene layer. It is impossible to deposit the high-quality AlN layer on a base substrate with a disordered structure or a crystal-free structure. However, it is able to deposit the high-quality AlN layer on the graphene layer with ordered atom arrangement.

Alternatively, prior to the step of depositing the AlN layer on the lattice matching layer by low-temperature pulse magnetron sputtering, the method further includes subjecting the graphene layer to heat treatment in vacuum or nitrogen at a temperature of 500 to 600° C. Through this step, it is able to provide the graphene layer with denser and more ordered atom arrangement.

In an alternative embodiment, the TFTs may be formed prior to the LEDs. In this case, the method includes steps of: providing a base substrate; forming a TFT including a gate electrode, a source electrode and a drain electrode on the base substrate; forming a passivation layer having a surface roughness not greater than a predetermined value on the base substrate with the TFT; forming a graphene layer including a first via-hole on the passivation layer; depositing an AlN layer on the graphene layer by low-temperature pulse magnetron sputtering; forming an n-type GaN layer on the AlN layer, and forming a second via-hole penetrating through the passivation layer, the AlN layer and the n-type GaN layer and located in the first via-hole; forming a via-hole electrode configured to connect the n-type GaN layer to the drain electrode through the second via-hole; and forming a pixel definition layer, a multilayered quantum well structure, a p-type GaN layer and a transparent electrode layer.

Alternatively, the step of forming the graphene layer including a first via-hole on the passivation layer includes: depositing single-layered or multilayered graphene on a copper foil, laminating the graphene layer on the copper foil into the base substrate with the passivation layer so as to attach the graphene layer onto the passivation layer, and etching off the copper foil by an etchant, so as to form the graphene layer including the first via-hole by plasma etching; or depositing single-layered or multilayered graphene onto the copper foil, patterning the graphene layer by plasma etching, and transferring the patterned graphene layer onto the base substrate with the passivation layer, so as to form the graphene layer including the first via-hole on the passivation layer; or etching the copper foil with an etchant to pattern the copper foil, depositing single-layered or multi-layered graphene onto the patterned copper foil, and transferring the graphene layer on the patterned copper foil onto the base substrate with the passivation layer, so as to form the graphene layer including the first via-hole on the passivation layer.

In another alternative embodiment, the LEDs may be formed prior to the TFTs. In this case, the method includes steps of: providing a base substrate; depositing a first transparent conductive layer on the base substrate; forming a graphene layer on the first transparent conductive layer; depositing an AlN layer onto the graphene layer by low-temperature pulse magnetron sputtering; forming an n-type GaN layer, a pixel definition layer, a multilayered quantum well structure, a p-type GaN layer and a second transparent conductive layer sequentially on the AlN layer; etching the pixel definition layer, the multilayered quantum well structure, the p-type GaN layer and the second transparent conductive layer at a channel region, so as to expose the n-type GaN layer at the channel region; etching the n-type GaN layer, the AlN layer and the graphene layer at the channel region, so as to form a first electrode hole penetrating through the n-type GaN layer, the AlN layer and the graphene layer; forming a first electrode configured to connect the n-type GaN layer to the first transparent conductive layer through the first electrode hole; forming a planarization layer, and forming the TFT including a gate electrode, a gate insulation layer, a source electrode and a drain electrode on the planarization layer; forming a second electrode hole penetrating through the gate insulation layer and the planarization layer; forming a second electrode configured to connect the p-type GaN layer to the drain electrode through the second electrode hole; and forming a passivation layer.

Alternatively, the step of forming the graphene layer on the first transparent conductive layer includes: depositing single-layered or multilayered graphene onto a copper foil, laminating the graphene layer on the copper foil onto the base substrate with the first transparent conductive layer so as to attach the graphene layer onto the first transparent conductive layer, and etching off the copper foil by an etchant; or depositing single-layered or multilayered graphene onto the copper foil, and transferring the graphene layer onto the base substrate with the first transparent conductive layer, so as to form the graphene layer on the first transparent conductive layer.

To be specific, the step of depositing the AlN layer on the lattice matching layer by low-temperature pulse magnetron sputtering includes sputtering an Al target with a bipolar pulse in a working gas at a temperature of 500 to 600° C. and at a pressure of 0.3 to 0.6 Pa, so as to form the AlN layer having a thickness of 30 to 100 nm. The pulse has a frequency of 10 to 100 kHz, a duration of an on-state signal is ¹⁄₁₀ to ½ of a duration of an off-state signal, the working gas is a mixture of $N_2$ (or $NH_3$) and Ar, and a deposition rate is 500 to 3000 nm/h.

Further, after the deposition of the AlN layer by low-temperature pulse magnetron sputtering, the n-type GaN layer may be formed by an identical low-temperature pulse magnetron sputtering device. The step of forming the n-type GaN layer includes forming the n-type GaN layer having a thickness of 1000 to 1500 nm on the AlN layer through a first mask plate by low-temperature pulse magnetron sputtering.

The first mask plate includes an aperture corresponding to a region where the n-type GaN layer is deposited, and a target is Ga doped with Si or O.

Further, after the deposition of the AlN layer by low-temperature pulse magnetron sputtering, the multilayered quantum well structure may be formed by the same low-temperature pulse magnetron sputtering device. The step of forming the multilayered quantum well structure includes sequentially depositing a GaN layer having a thickness of 8 to 10 nm and an indium gallium nitride (InGaN) layer having a thickness of 3 to 5 nm on the n-type GaN layer using undoped Ga and In-doped Ga as targets through a second mask plate by low-temperature pulse magnetron sputtering, and repeating the deposition procedure five times, so as to form the multilayered quantum well structure. The second mask plate includes an aperture corresponding to a region where the multilayered quantum well structure is deposited.

Further, after the deposition of the AlN layer by low-temperature pulse magnetron sputtering, the p-type GaN layer may be formed by the same low-temperature pulse magnetron sputtering device. The step of forming the p-type GaN layer includes forming the p-type GaN layer having a thickness of 500 to 800 nm on the multilayered quantum well structure through a third mask plate by low-temperature pulse magnetron sputtering. The third mask plate includes an aperture corresponding to a region where the p-type GaN layer is deposited, and a target is Mg-doped Ga.

In the embodiments of the present disclosure, the base substrate may be a glass substrate. In the related art, a manufacture temperature for the GaN LED is up to 1000° C., so the GaN LED may merely be manufactured on a sapphire or silicon substrate. However, according to the method in the embodiments of the present disclosure, it is able to reduce an operating temperature for the manufacture, i.e., to manufacture the GaN LED on the glass substrate with a tolerable temperature of 500 to 700° C.

The present disclosure further provides in some embodiments a display substrate including a plurality of TFTs. The display substrate further includes: a lattice matching layer; an AlN layer formed on the lattice matching layer; and GaN LEDs formed on the AlN layer and each including an n-type GaN layer, a multilayered quantum well structure and a p-type GaN layer and corresponding to one of the TFTs.

According to the display substrate in the embodiments of the present disclosure, the lattice matching layer including atoms arranged regularly and densely is formed on the base substrate, then the high-quality AlN layer is formed on the lattice matching layer by low-temperature pulse magnetron sputtering, and then the GaN LED including the n-type GaN layer, the multilayered quantum well structure and the p-type GaN layer is formed on the AlN layer. As a result, it is able to form the GaN LED on a large-size substrate.

To be specific, the lattice matching layer may be a graphene layer. It is impossible to deposit the high-quality AlN layer on a base substrate with a disordered structure or a crystal-free structure. However, it is able to deposit the high-quality AlN layer on the graphene layer with ordered atom arrangement.

In an alternative embodiment, the TFTs may be formed prior to the LEDs. In this case, the display substrate includes: a base substrate; a TFT formed on the base substrate and including a gate electrode, a source electrode and a drain electrode; a passivation layer formed on the base substrate with the TFT and having a surface roughness not greater than a predetermined value; a graphene layer formed on the passivation layer and including a first via-hole; an AlN layer formed on the graphene layer; an n-type GaN layer formed on the AlN layer, and a second via-hole penetrating through the passivation layer, the AlN layer and the n-type GaN layer and located within the first via-hole; a via-hole electrode configured to connect the n-type GaN layer to the drain electrode through the second via-hole; and a pixel definition layer, a multilayered quantum well structure, a p-type GaN layer and a transparent electrode layer formed on the base substrate with the via-hole electrode.

In another alternative embodiment, the LEDs may be formed prior to the TFTs. In this case, the display substrate includes: a base substrate; a first transparent conductive layer formed on the base substrate; a graphene layer formed on the first transparent conductive layer; an AlN layer formed on the graphene layer; an n-type GaN layer, a pixel definition layer, a multilayered quantum well structure, a p-type GaN layer and a second transparent conductive layer formed on the AlN layer, and a first electrode hole penetrating through the n-type GaN layer, the AlN layer and the graphene layer; a first electrode configured to connect the n-type GaN layer to the first transparent conductive layer through the first electrode hole; a planarization layer formed on the base substrate with the first electrode; a TFT formed on the planarization layer and including a gate electrode, a gate insulation layer, a source electrode and a drain electrode; a second electrode hole penetrating through the gate insulation layer and the planarization layer; a second electrode configured to connect the p-type GaN layer to the drain electrode through the second electrode hole; and a passivation layer formed on the base substrate with the second electrode.

The present disclosure further provides in some embodiments a display device including the above-mentioned display substrate. The display substrate may be any product or member having a display function, such as a display panel, a television, a display, a digital photo frame, a mobile phone or a flat-panel computer.

The method for manufacturing the display substrate will be described hereinafter in conjunction with the drawings and embodiments.

In the related art, a low-temperature pulse magnetron sputtering device is mainly used for the deposition of an insulator, so as to form an insulating film with dense crystals within a short period of time. Along with the development of the technology, currently the low-temperature pulse magnetron sputtering device may be used to deposit various oxides, nitrides and carbides. In the embodiments of the present disclosure, the AlN layer is deposited by low-temperature pulse magnetron sputtering. In addition, prior to the deposition of the AlN layer, the graphene layer with atoms arranged regularly and densely is formed on the base substrate. In this way, it is able to form the high-quality AlN layer on the graphene layer by low-temperature pulse magnetron sputtering, thereby to manufacture the GaN LEDs on a large-size substrate.

As shown in FIG. 1, which is a plan view of the display substrate, the display substrate includes TFTs and GaN LEDs each corresponding to one of the TFTs. Each GaN LED includes an n-type GaN layer, a multilayered quantum well structure and a p-type GaN layer. An optical wavelength of light from the GaN LED may depend on a content of In in InGaN of the multilayered quantum well structure, so that the GaN LED may emit light in red (R), green (G) and blue (B) colors. The method for manufacturing the display substrate may include the following steps.

Step 1: providing a base substrate 1, and forming a TFT on the base substrate 1. The step of forming the TFT includes Steps 101 to 105.

Step 101: forming a gate electrode 2 of the TFT on the base substrate 1. The substrate 1 may be a quartz substrate or a glass substrate. To be specific, the base substrate 1 may be a glass substrate having a thickness of 0.4 to 0.7 mm. The base substrate 1 may be washed at first, and then a gate metal layer having a thickness of 250-1600 nm may be deposited on the base substrate 1 by sputtering or thermal evaporation. The gate metal layer may be made of Cu, Al, Ag, Mo, Cr, Nd, Ni, Mn, Ti, Ta, W, or an alloy thereof, and it may be of a single-layered structure, or a multilayered structure such as Cu/Mo, Ti/Cu/Ti or Mo/Al/Mo. A photoresist may be applied onto the gate metal layer, and then exposed through a mask plate, so as to form a photoresist reserved region corresponding to a region where patterns of a gate line and the gate electrode 2 are located and a photoresist unreserved region corresponding to the other regions. Then, the photoresist may be developed, so as to remove the photoresist at the photoresist unreserved region, and maintain a thickness of the photoresist at the photoresist reserved region unchanged. The gate metal layer at the photoresist unreserved region may then be fully etched off by an etching process, and the remaining photoresist may be removed, so as to form the patterns of the gate line and the gate electrode 2.

Step 102: forming a gate insulation layer 3 and an active layer 4. To be specific, the gate insulation layer 3 having a thickness of about 100-600 nm may be deposited on the base substrate obtained after Step 101 by plasma enhanced chemical vapor deposition (PECVD). The gate insulation layer may be made of an oxide, a nitride or an oxynitride, and it may be of a single-layered structure, a double-layered structure or a multilayered structure. The gate insulation layer may be made of SiNx, SiOx or Si(ON)x. For example, the gate insulation layer 3 may be of a double-layered structure consisting of a SiNx layer having a thickness of 50 nm and a $SiO_2$ layer having a thickness of 100 nm. Then, an a-Si:H layer having a thickness of 40-60 nm may be deposited on the gate insulation layer 3, and subjected to excimer laser annealing (ELA) treatment to form a poly-Si layer. A photoresist may be applied onto the poly-Si layer, and then exposed, developed and dry-etched, so as to form a pattern of the active layer 4.

Step 103: forming a pattern of an etch stop layer 5. To be specific, an etch stop layer having a thickness of 40-500 nm may be deposited on the base substrate 1 obtained after Step 102 by magnetron sputtering, thermal evaporation, PECVD or any other film-forming methods. The etch stop layer may be made of an oxide, a nitride or an oxynitride. For example, the etch stop layer may be made of SiNx, SiOx or Si(ON)x. The etch stop layer may be of a single-layered structure, or a double-layered structure consisting of a SiNx layer and a SiOx layer. For example, the etch stop layer may be a double-layered structure consisting of a SiNx layer having a thickness of 300 nm and a $SiO_2$ layer having a thickness of 200 nm. Then, a photoresist may be applied onto the etch stop layer, and then exposed through a mask plate, so as to form a photoresist reserved region corresponding to a region where a pattern of the etch stop layer 5 is located and a photoresist unreserved region corresponding to the other regions. Next, the photoresist may be developed, so as to fully remove the photoresist at the photoresist unreserved region and maintain a thickness of the photoresist at the photoresist reserved region unchanged. Then, an intermediate insulation layer at the photoresist unreserved region may be fully etched off by an etching process, and the remaining photoresist may be removed, so as to form the pattern of the etch stop layer 5 including a via-hole.

Step 104: forming patterns of a source electrode 7 and a drain electrode 6. To be specific, a source/drain metal layer having a thickness of about 200-600 nm may be deposited on the base substrate 1 obtained after Step 103 by magnetron sputtering, thermal evaporation or any other film-forming method. The source/drain metal layer may be made of Cu, Al, Ag, Mo, Cr, Nd, Ni, Mn, Ti, Ta, W or an alloy thereof and it may be of a single-layered structure, or a multilayered structure such as Cu/Mo, Ti/Cu/Ti or Mo/Al/Mo. For example, the source/drain metal layer may be of a triple-layered structure consisting of a Ti layer having a thickness of 50 nm, an Al layer having a thickness of 200 nm and another Ti layer having a thickness of 50 nm. Then, a photoresist may be applied to the source/drain metal layer, and exposed through a mask plate, so as to form a photoresist reserved region corresponding to a region where patterns of the source electrode 7, the drain electrode 6 and a data line are located and a photoresist unreserved region corresponding to the other regions. Next, the photoresist may be developed, so as to fully remove the photoresist at the photoresist unreserved region and maintain a thickness of the photoresist reserved region unchanged. Then, the source/drain metal layer at the photoresist unreserved region may be fully etched off by an etching process, and the remaining photoresist may be removed, so as to form the source electrode 7, the drain electrode 6 and the data line.

Step 105: forming a passivation layer 8. To be specific, the passivation layer having a thickness of 40-500 nm may be formed on the base substrate 1 obtained after Step 104 by magnetron sputtering, thermal evaporation, PECVD or any other film-forming method. The passivation layer may be made of an oxide, a nitride or an oxynitride. For example, the passivation layer may be made of SiNx, SiOx or Si(ON)x. The passivation layer may be of a single-layered structure, or a double-layered structure consisting of a SiNx layer and a SiOx layer.

Figure 2:
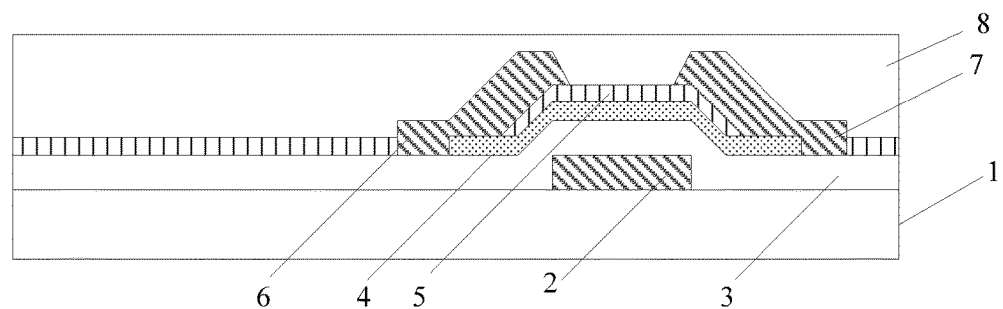
FIG. 2 is a schematic view showing a display substrate after the formation a TFT according to one embodiment of the present disclosure.

FIG. 2 shows the resultant display substrate obtained after Steps 101 to 105.

Step 2: subjecting the passivation layer 8 to planarization treatment. In the related art, a resin layer may be formed on the passivation layer, so as to provide a flat surface for the transferring of the graphene layer as well as a better insulation property. In the embodiments of the present disclosure, no resin layer may be provided, but the passivation layer 8 may be directly subject to the planarization treatment. To be specific, the passivation layer made of a nitride may be subjected to chemico-mechanical polishing treatment, so as to provide the passivation layer with a surface roughness less than a predetermined value. For example, several pairs of highest points and lowest points on the surface of the passivation layer may be selected, and then an average value of root-mean-square values of a height difference between the highest points and the lowest points may be calculated. When the average value is less than 50 nm, it may be deemed that the flatness of the passivation layer 8 has met the demand. When the flatness of the passivation layer 8 has met the demand prior to the planarization treatment, no planarization treatment is needed.

Figure 3:
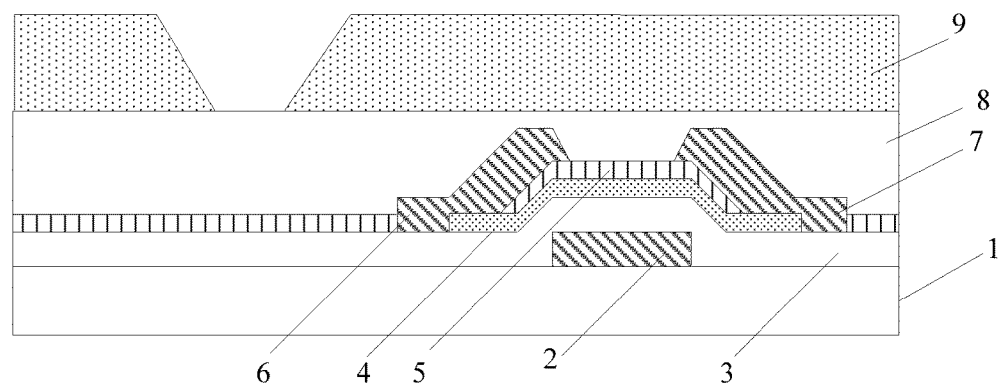
FIG. 3 is a schematic view showing the display substrate after the formation of a graphene layer according to one embodiment of the present disclosure.

Step 3: forming a pattern of a graphene layer 9 including a via-hole. To be specific, as shown in FIG. 3, the graphene layer 9 may be formed on the base substrate 1 obtained after Step 2. The graphene layer 9 may be of a single-layered structure or a multilayered structure, and may have a thickness of 1-5 nm. The graphene layer 9 with ordered atom arrangement is used for the subsequent deposition of the AlN layer by low-temperature pulse magnetron sputtering. This is because, it is impossible to deposit the high-quality monocrystalline nitride on the substrate with a disordered or crystal-free structure, and thereby it is impossible to directly manufacture the GaN LED directly on the passivation layer 8.

The pattern of the graphene layer may be formed in various modes.

Figure 11:
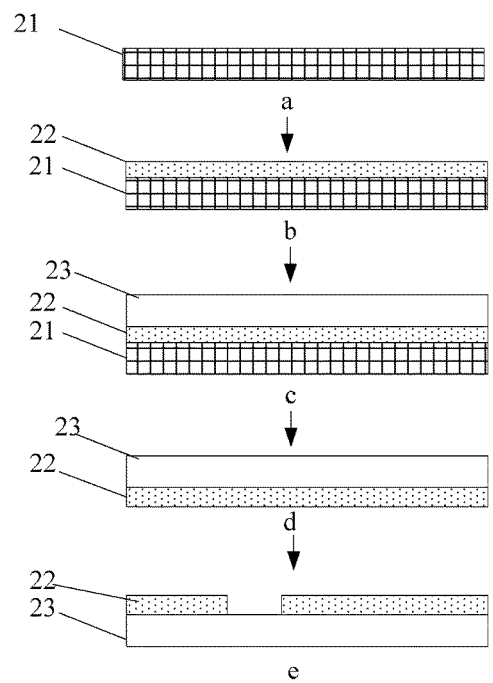
FIGS. 11-13 are schematic views showing a procedure for forming the graphene layer according to one embodiment of the present disclosure.

Mode A: as shown in FIG. 11, the pattern of the graphene layer may be formed by: step a of providing a copper foil 21; step b of depositing a single-layered or multilayered graphene layer 22 on the copper foil 21; step c of laminating the graphene layer 22 on the copper foil 21 onto the base substrate 23 with the passivation layer; step d of etching the copper foil 21 with an acidic solution, so that the graphene layer 22 is attached, under the effect of Van der Waals' force, onto the base substrate 23; and step e of forming the pattern of the graphene layer 22 by a plasma etching process.

Figure 12:
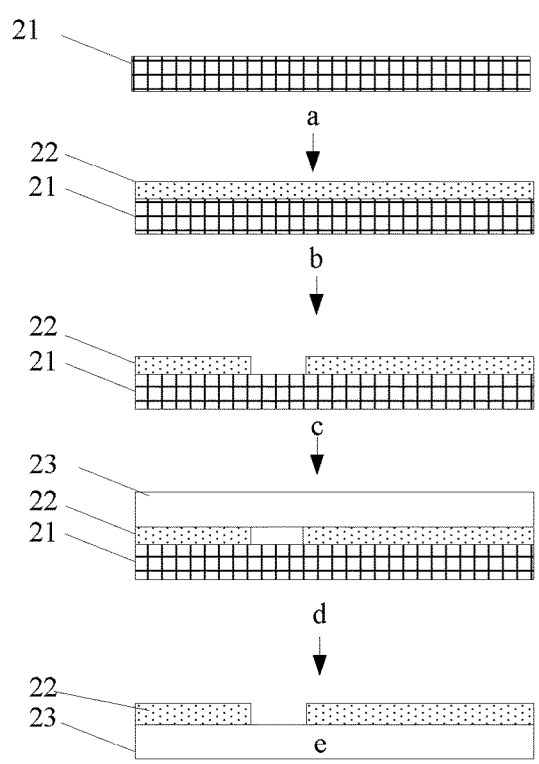

Mode B: as shown in FIG. 12, the pattern of the graphene layer may be formed by: step a of providing the copper foil 21; step b of depositing a single-layered or multilayered graphene layer 22 onto the copper foil 21; step c of forming the pattern of the graphene layer 22 by plasma etching; step d of laminating the graphene layer 22 on the copper foil 21 onto the base substrate 23 with the passivation layer; and step e of etching the copper foil 21 with an acidic solution so that the graphene layer 22 is attached, under the effect of Van der Waals' force, onto the base substrate 23.

Figure 13:
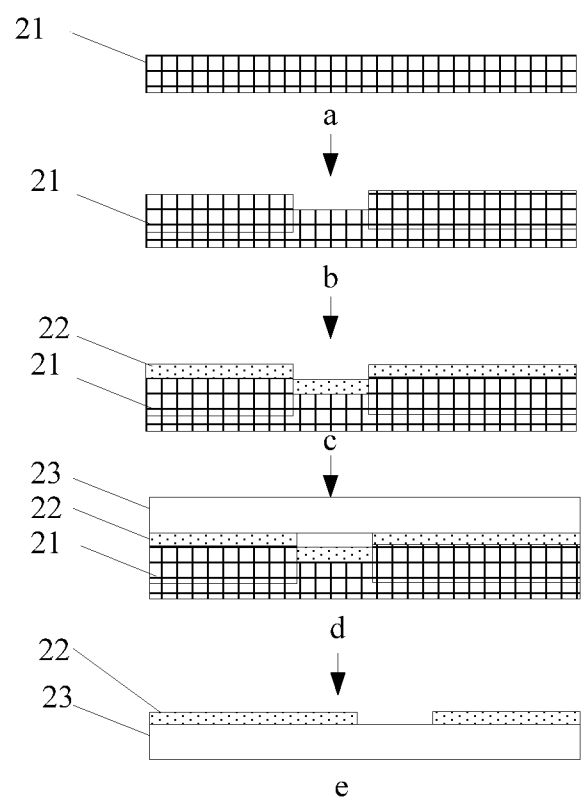

Mode C: as shown in FIG. 13, the pattern of the graphene layer may be formed by: step a of providing the copper foil 21; step b of forming a pattern of the copper foil 21 by plasma etching or an acidic solution; step c of depositing a single-layered or multilayered graphene layer 22 on the copper foil 21; step d of transferring the graphene layer 22 on the copper foil 21 onto the base substrate 23 with the passivation layer, so as to form a pattern of the graphene layer 22; and step e of removing the copper foil 21. Further, after the formation of the graphene layer 22, the graphene layer 22 may be subjected to thermal treatment in vacuum or nitrogen at a temperature of 500 to 600° C. In this way, it is able to provide the graphene layer with denser and more ordered atom arrangement. The terminal treatment may include, but not limited to, ELA, rapid thermal annealing (RTA) or slow annealing.

Figure 4:
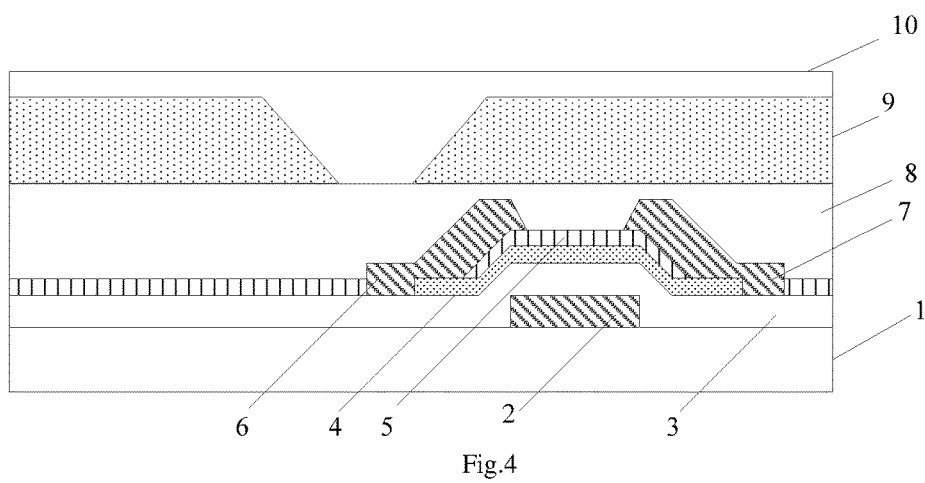
FIG. 4 is a schematic view showing the display substrate after the formation of an AlN layer according to one embodiment of the present disclosure.

Step 4: depositing an AlN layer 10 by low-temperature pulse magnetron sputtering. To be specific, an Al target may be sputtered using a bipolar pulse in a working gas at a temperature of 500-600° C. and at a pressure of 0.3-0.6 Pa, so as to form the AlN layer 10 having a thickness of 30-100 nm, as shown in FIG. 4. The pulse has a frequency of 10 to 100 kHz, a duration of an on-state signal is ⅒ to ½ of a duration of an off-state signal, the working gas is a mixture of $N_2$ (or $NH_3$) and Ar, and a deposition rate is 500 to 3000 nm/h.

Figure 5:
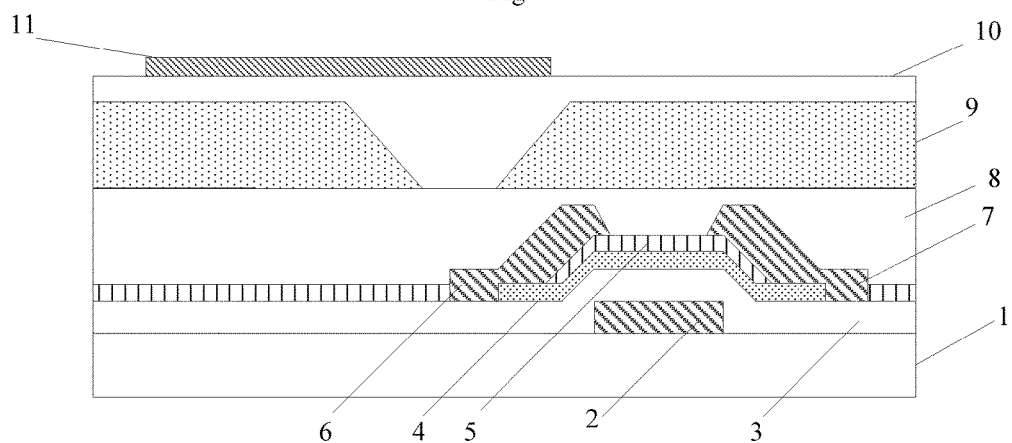
FIG. 5 is a schematic view showing the display substrate after the formation of an n-type GaN layer according to one embodiment of the present disclosure.

Step 5: forming an n-type GaN layer 11. To be specific, the n-type GaN layer 11 having a thickness of 1000-1500 nm may be formed on the AlN layer 10 through a first mask plate by low-temperature pulse magnetron sputtering, as shown in FIG. 5. The first mask plate includes an aperture corresponding to a region where the n-type GaN layer is deposited, and the target may be Si-doped or O-doped Ga. Prior to the deposition of the n-type GaN layer, the AlN layer 10 may be pre-treated with pulse plasma, so as to provide a clean surface.

Figure 6:
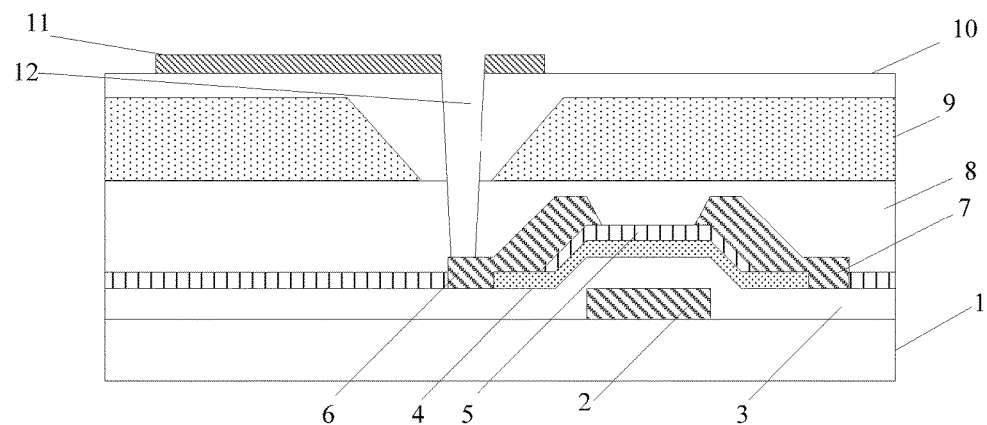
FIG. 6 is a schematic view showing the display substrate after the formation of a second via-hole according to one embodiment of the present disclosure.

Step 6: forming a second via-hole 12 penetrating through the passivation layer 8, the AlN layer 10 and the n-type GaN layer 11. As shown in FIG. 6, the second via-hole 12 is located within the via-hole in the graphene layer 9. To be specific, when the passivation layer 8 is made of SiNx, the second via-hole 12 penetrating through the passivation layer 8, the AlN layer 10 and the n-type GaN layer 11 may be formed by a single etching process. Of course, the second via-hole 12 may also be formed by two or three etching processes in accordance with the practical need.

Figure 7:
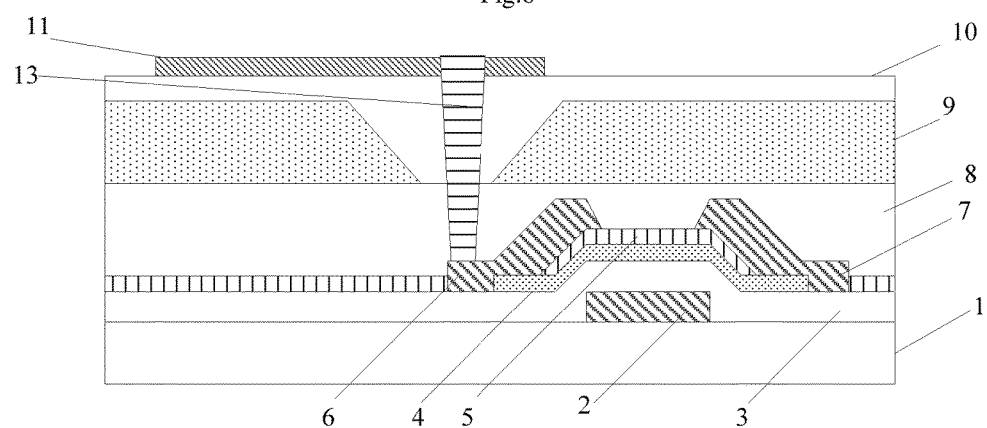
FIG. 7 is a schematic view showing the display substrate after the formation of a via-hole electrode according to one embodiment of the present disclosure.

Step 7: forming a via-hole electrode 13. As shown in FIG. 7, the via-hole electrode 13 is located within the second via-hole 12. To be specific, the via-hole electrode 13 may be formed by depositing a conductive metal material in the second via-hole 12 by sputtering, electron beam deposition or thermal evaporation, so as to electrically connect the n-type GaN layer 11 to the drain electrode 6.

Figure 8:
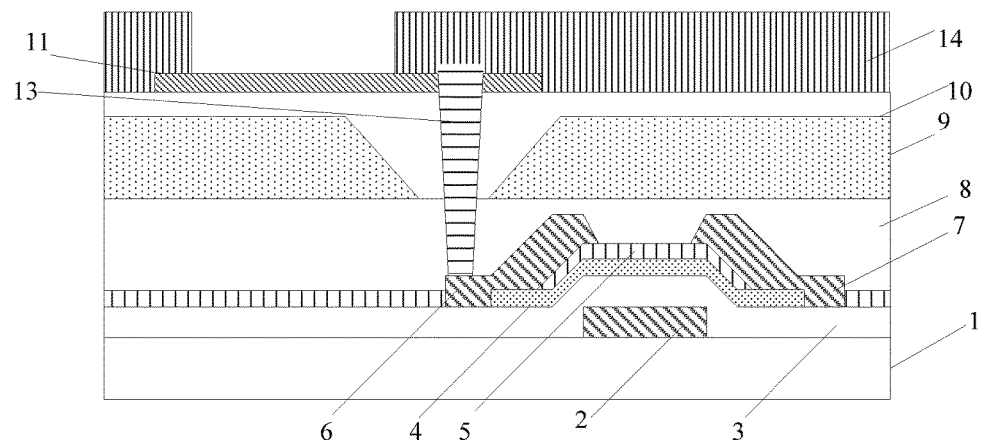
FIG. 8 is a schematic view showing the display substrate after the formation of a pixel definition layer according to one embodiment of the present disclosure.

Step 8: forming a pixel definition layer 14. Usually, a conventional pixel definition layer is made of an organic layer. However, considering a temperature for the subsequent deposition of GaN, the pixel definition layer in the embodiments of the present disclosure may be made of an inorganic material, which may include but not limited to $Al_2O_3$, $SiO_2$, AlN, TiNx, WNx or SiNx. The inorganic material may be deposited by chemical vapor deposition or pulse magnetron sputtering. In order to simplify a production device, AlN may be deposited by low-temperature pulse magnetron sputtering, so as to form the pixel definition layer 14 on the base substrate 1 obtained after Step 7 through a third mask plate, as shown in FIG. 8. The third mask plate includes an aperture corresponding to a region where the pixel definition layer 14 is deposited. A crystal structure of the pixel definition layer is not highly demanded, so the deposition temperature may be reduced appropriately. A barrier having a thickness of about 200 nm and formed by the pixel definition layer 14 may surround the n-type GaN 11, and a region surrounded by the pixel definition layer 14 is just a region where a multilayered quantum well structure is grown.

Figure 9:
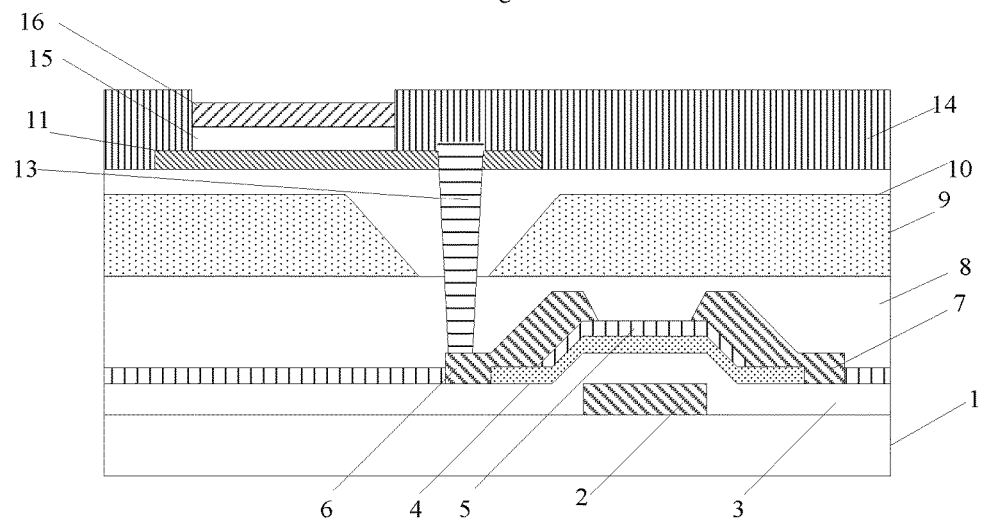
FIG. 9 is a schematic view showing the display substrate after the formation of a multilayered quantum well structure and a p-type GaN layer according to one embodiment of the present disclosure.

Step 9: forming the multilayered quantum well structure 15. To be specific, a GaN layer having a thickness of 8 to 10 nm and an InGaN layer having a thickness of 3 to 5 nm may be deposited on the n-type GaN layer 11 using undoped Ga and In-doped Ga as targets through a second mask plate by low-temperature pulse magnetron sputtering, and the deposition procedure may be repeated five times, so as to form the multilayered quantum well structure 15, as shown in FIG. 9. The second mask plate includes an aperture corresponding to a region where the multilayered quantum well structure is deposited. Prior to the deposition of the multilayered quantum well structure 15, the n-type GaN layer 11 may be pre-treated with pulse plasma, so as to provide a clean surface.

Step 10: forming a p-type GaN layer 16. To be specific, the p-type GaN layer 16 having a thickness of 500-800 nm may be formed on the multilayered quantum well structure 15 through a third mask plate by low-temperature pulse magnetron sputtering, as shown in FIG. 9. The third mask plate includes an aperture corresponding to a region where the p-type GaN layer is deposited, and Mg-doped Ga is used as the target. Prior to the deposition of the p-type GaN layer 16, the multilayered quantum well structure 15 may be pre-treated with pulse plasma so as to provide a clean surface.

Figure 10:
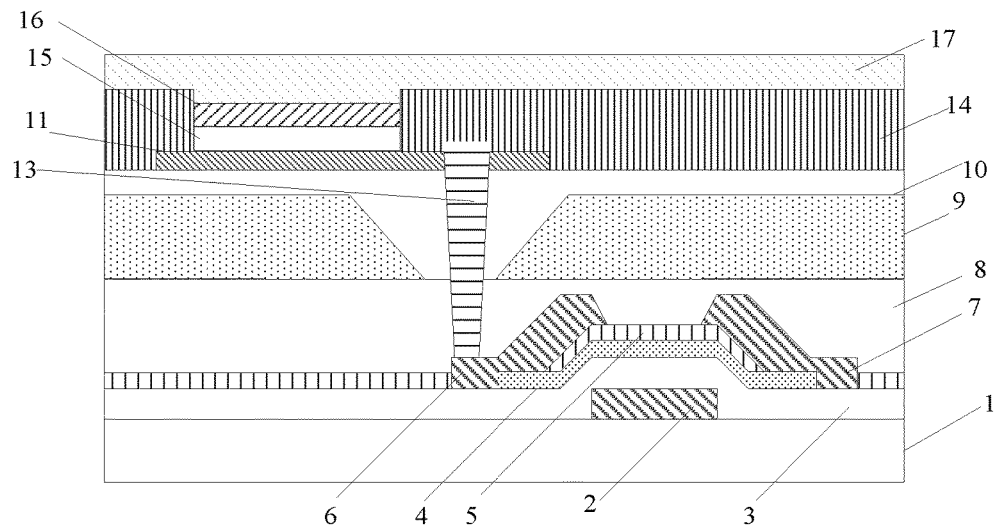
FIG. 10 is a schematic view showing the display substrate after the formation of a transparent electrode layer according to one embodiment of the present disclosure.

Step 11: forming a transparent electrode layer 17. To be specific, the transparent electrode layer 17 may be formed through a fourth mask plate using a metal evaporation device, as shown in FIG. 10. The fourth mask plate includes an aperture corresponding to a region where the transparent electrode layer 17 is deposited.

Through the above-mentioned Steps 1-11, it is able to form an active matrix GaN LED display device capable of emitting light upward.

Figure 14:
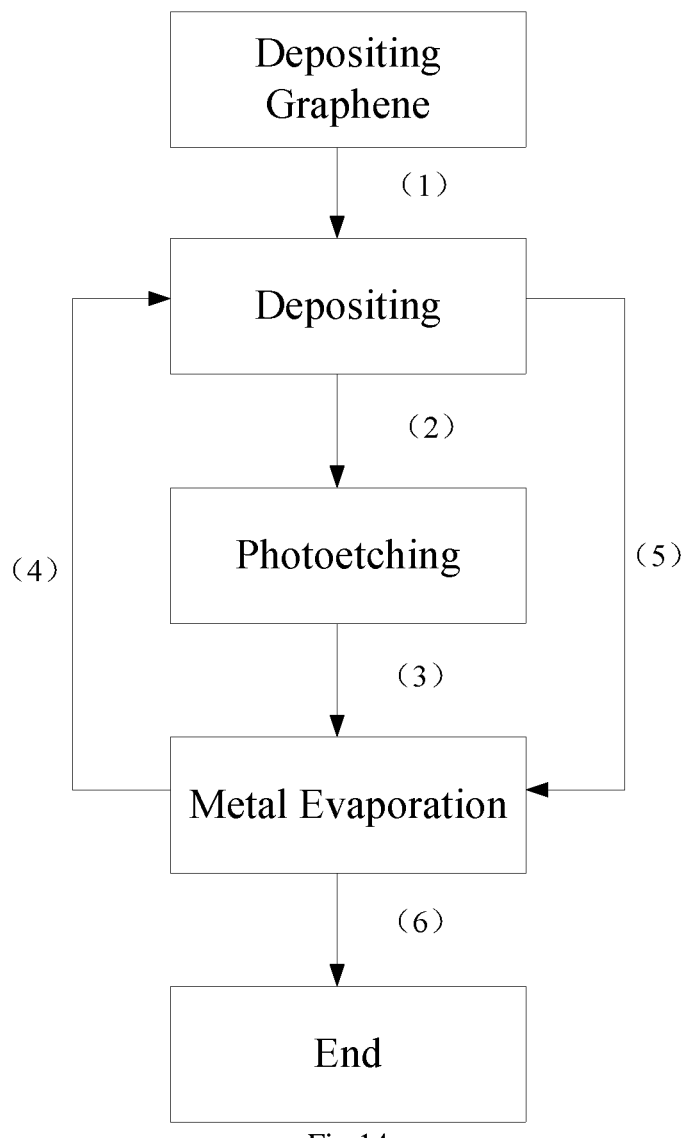
FIG. 14 is a schematic view showing a procedure for forming an LED according to one embodiment of the present disclosure.

As shown in FIG. 14 which shows a procedure for forming the LED, (1) after the transferring of the graphene layer, the base substrate enters a pulse magnetron sputtering device so as to deposit thereon the AlN layer and the n-type layer. (2) Then, the base substrate enters an exposure device and an etcher sequentially, so as to form the second via-hole. (3) Next, the base substrate enters a metal evaporation device, so as to form the via-hole electrode. (4) Next, the base substrate enters the pulse magnetron sputtering device so as to deposit thereon the pixel definition layer, the multilayered quantum well structure and the p-type GaN layer. (5) Then, the base substrate enters the metal evaporation device again, so as to deposit thereon the transparent electrode layer. (6) Finally, the entire procedure is completed.

The present disclosure further provides in some embodiments another method for manufacturing the display substrate, which may include the following steps.

Step 1: providing a base substrate 1, and forming a TFT on the base substrate 1. The step of forming the TFT includes Steps 101 to 105.

Step 101: forming a gate electrode 2 of the TFT on the base substrate 1. The substrate 1 may be a quartz substrate or a glass substrate. To be specific, the base substrate 1 may be a glass substrate having a thickness of 0.4 to 0.7 mm. The base substrate 1 may be washed at first, and then a gate metal layer having a thickness of 250-1600 nm may be deposited on the base substrate 1 by sputtering or thermal evaporation. The gate metal layer may be made of Cu, Al, Ag, Mo, Cr, Nd, Ni, Mn, Ti, Ta, W, or an alloy thereof, and it may be of a single-layered structure, or a multilayered structure such as Cu/Mo, Ti/Cu/Ti or Mo/Al/Mo. A photoresist may be applied onto the gate metal layer, and then exposed through a mask plate, so as to form a photoresist reserved region corresponding to a region where patterns of a gate line and the gate electrode 2 are located and a photoresist unreserved region corresponding to the other regions. Then, the photoresist may be developed, so as to remove the photoresist at the photoresist unreserved region, and maintain a thickness of the photoresist at the photoresist reserved region unchanged. The gate metal layer at the photoresist unreserved region may then be fully etched off by an etching process, and the remaining photoresist may be removed, so as to form the patterns of the gate line and the gate electrode 2.

Step 102: forming a gate insulation layer 3 and an active layer 4. To be specific, the gate insulation layer 3 having a thickness of about 100-600 nm may be deposited on the base substrate obtained after Step 101 by PECVD. The gate insulation layer may be made of an oxide, a nitride or an oxynitride, and it may be of a single-layered structure, a double-layered structure or a multilayered structure. The gate insulation layer may be made of SiNx, SiOx or Si(ON)x. For example, the gate insulation layer 3 may be of a double-layered structure consisting of a SiNx layer having a thickness of 50 nm and a $SiO_2$ layer having a thickness of 100 nm. Then, an a-Si:H layer having a thickness of 40-60 nm may be deposited on the gate insulation layer 3, and subjected to ELA treatment to form a poly-Si layer. A photoresist may be applied onto the poly-Si layer, and then exposed, developed and dry-etched, so as to form a pattern of the active layer 4.

Step 103: forming a pattern of an etch stop layer 5. To be specific, an etch stop layer having a thickness of 40-500 nm may be deposited on the base substrate 1 obtained after Step 102 by magnetron sputtering, thermal evaporation, PECVD or any other film-forming methods. The etch stop layer may be made of an oxide, a nitride or an oxynitride. For example, the etch stop layer may be made of SiNx, SiOx or Si(ON)x. The etch stop layer may be of a single-layered structure, or a double-layered structure consisting of a SiNx layer and a SiOx layer. For example, the etch stop layer may be a double-layered structure consisting of a SiNx layer having a thickness of 300 nm and a $SiO_2$ layer having a thickness of 200 nm. Then, a photoresist may be applied onto the etch stop layer, and then exposed through a mask plate, so as to form a photoresist reserved region corresponding to a region where a pattern of the etch stop layer 5 is located and a photoresist unreserved region corresponding to the other regions. Next, the photoresist may be developed, so as to fully remove the photoresist at the photoresist unreserved region and maintain a thickness of the photoresist at the photoresist reserved region unchanged. Then, an intermediate insulation layer at the photoresist unreserved region may be fully etched off by an etching process, and the remaining photoresist may be removed, so as to form the pattern of the etch stop layer 5 including a via-hole.

Step 104: forming patterns of a source electrode 7 and a drain electrode 6. To be specific, a source/drain metal layer having a thickness of about 200-600 nm may be deposited on the base substrate 1 obtained after Step 103 by magnetron sputtering, thermal evaporation or any other film-forming method. The source/drain metal layer may be made of Cu, Al, Ag, Mo, Cr, Nd, Ni, Mn, Ti, Ta, W or an alloy thereof and it may be of a single-layered structure, or a multilayered structure such as Cu/Mo, Ti/Cu/Ti or Mo/Al/Mo. For example, the source/drain metal layer may be of a triple-layered structure consisting of a Ti layer having a thickness of 50 nm, an Al layer having a thickness of 200 nm and another Ti layer having a thickness of 50 nm. Then, a photoresist may be applied to the source/drain metal layer, and exposed through a mask plate, so as to form a photoresist reserved region corresponding to a region where patterns of the source electrode 7, the drain electrode 6 and a data line are located and a photoresist unreserved region corresponding to the other regions. Next, the photoresist may be developed, so as to fully remove the photoresist at the photoresist unreserved region and maintain a thickness of the photoresist reserved region unchanged. Then, the source/drain metal layer at the photoresist unreserved region may be fully etched off by an etching process, and the remaining photoresist may be removed, so as to form the source electrode 7, the drain electrode 6 and the data line.

Step 105: forming a passivation layer 8. To be specific, the passivation layer having a thickness of 40-500 nm may be formed on the base substrate 1 obtained after Step 104 by magnetron sputtering, thermal evaporation, PECVD or any other film-forming method. The passivation layer may be made of an oxide, a nitride or an oxynitride. For example, the passivation layer may be made of SiNx, SiOx or Si(ON)x. The passivation layer may be of a single-layered structure, or a double-layered structure consisting of a SiNx layer and a SiOx layer.

FIG. 2 shows the resultant display substrate obtained after Steps 101 to 105.

Step 2: subjecting the passivation layer 8 to planarization treatment. In the related art, a resin layer may be formed on the passivation layer, so as to provide a flat surface for the transferring of the graphene layer as well as a better insulation property. In the embodiments of the present disclosure, no resin layer may be provided, but the passivation layer 8 may be directly subject to the planarization treatment. To be specific, the passivation layer made of a nitride may be subjected to chemico-mechanical polishing treatment, so as to provide the passivation layer with a surface roughness less than a predetermined value. For example, several pairs of highest points and lowest points on the surface of the passivation layer may be selected, and then an average value of root-mean-square values of a height difference between the highest points and the lowest points may be calculated. When the average value is less than 50 nm, it may be deemed that the flatness of the passivation layer 8 has met the demand. When the flatness of the passivation layer 8 has met the demand prior to the planarization treatment, no planarization treatment is needed.

Step 3: forming a pattern of a graphene layer 9 including a via-hole. To be specific, as shown in FIG. 3, the graphene layer 9 may be formed on the base substrate 1 obtained after Step 2. The graphene layer 9 may be of a single-layered structure or a multilayered structure, and may have a thickness of 1-5 nm. The graphene layer 9 with ordered atom arrangement is used for the subsequent deposition of the AlN layer by low-temperature pulse magnetron sputtering. This is because, it is impossible to deposit the high-quality monocrystalline nitride on the substrate with a disordered or crystal-free structure, and thereby it is impossible to directly manufacture the GaN LED directly on the passivation layer 8.

The pattern of the graphene layer may be formed in various modes.

Mode A: as shown in FIG. 11, the pattern of the graphene layer may be formed by: step a of providing a copper foil 21; step b of depositing a single-layered or multilayered graphene layer 22 on the copper foil 21; step c of laminating the graphene layer 22 on the copper foil 21 onto the base substrate 23 with the passivation layer; step d of etching the copper foil 21 with an acidic solution, so that the graphene layer 22 is attached, under the effect of Van der Waals' force, onto the base substrate 23; and step e of forming the pattern of the graphene layer 22 by a plasma etching process.

Mode B: as shown in FIG. 12, the pattern of the graphene layer may be formed by: step a of providing the copper foil 21; step b of depositing a single-layered or multilayered graphene layer 22 onto the copper foil 21; step c of forming the pattern of the graphene layer 22 by plasma etching; step d of laminating the graphene layer 22 on the copper foil 21 onto the base substrate 23 with the passivation layer; and step e of etching the copper foil 21 with an acidic solution, so that the graphene layer 22 is attached, under the effect of Van der Waals' force, onto the base substrate 23.

Mode C: as shown in FIG. 13, the pattern of the graphene layer may be formed by: step a of providing the copper foil 21; step b of forming a pattern of the copper foil 21 by plasma etching or an acidic solution; step c of depositing a single-layered or multilayered graphene layer 22 on the copper foil 21; step d of transferring the graphene layer 22 on the copper foil 21 onto the base substrate 23 with the passivation layer, so as to form a pattern of the graphene layer 22; and step e of removing the copper foil 21. Further, after the formation of the graphene layer 22, the graphene layer 22 may be subjected to thermal treatment in vacuum or nitrogen at a temperature of 500 to 600° C. In this way, it is able to provide the graphene layer with denser and more ordered atom arrangement. The terminal treatment may include, but not limited to, ELA, rapid thermal annealing (RTA) or slow annealing.

Step 4: depositing an AlN layer 10 by low-temperature pulse magnetron sputtering. To be specific, an Al target may be sputtered using a bipolar pulse in a working gas at a temperature of 500-600° C. and at a pressure of 0.3-0.6 Pa, so as to form the AlN layer 10 having a thickness of 30-100 nm, as shown in FIG. 4. The pulse has a frequency of 10 to 100 kHz, a duration of an on-state signal is $\frac{1}{10}$ to $\frac{1}{2}$ of a duration of an off-state signal, the working gas is a mixture of $N_2$ (or $NH_3$) and Ar, and a deposition rate is 500 to 3000 nm/h.

Figure 15:
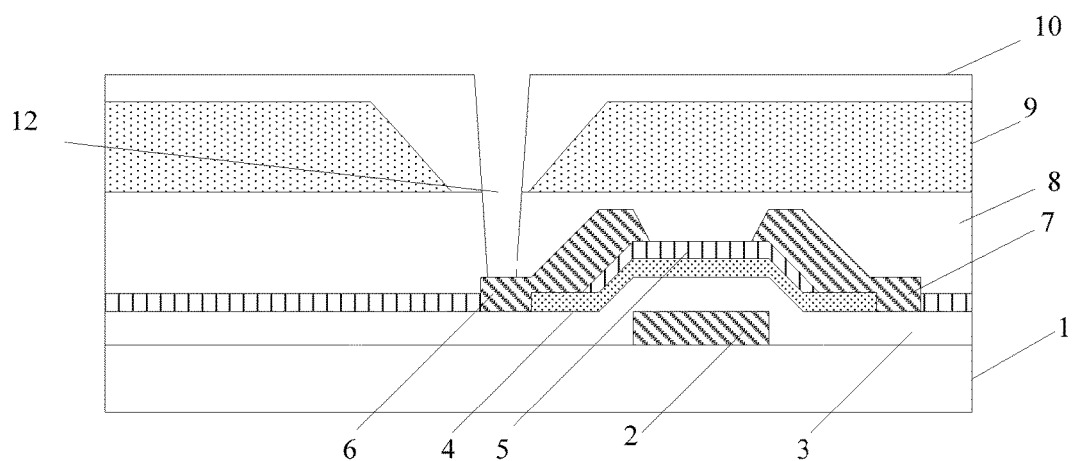
FIG. 15 is another schematic view showing the display substrate after the formation of the second via-hole according to one embodiment of the present disclosure.

Step 5: forming a second via-hole 12 penetrating through the passivation layer 8 and the AlN layer 10. As shown in FIG. 15, the second via-hole 12 is located within the via-hole in the graphene layer 9. To be specific, when the passivation layer 8 is made of SiNx, the second via-hole 12 penetrating through the passivation layer 8 and the AlN layer 10 may be formed by a single etching process. Of course, the second via-hole 12 may also be formed by two or three etching processes in accordance with the practical need.

Figure 16:
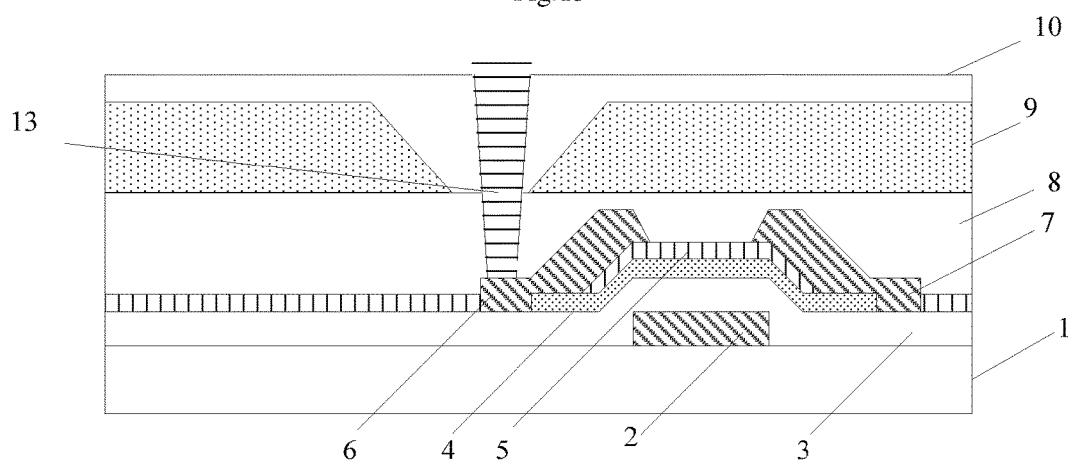
FIG. 16 is another schematic view showing the display substrate after the formation a first portion of the electrode according to one embodiment of the present disclosure.

Step 6: forming a first portion of a via-hole electrode 13. As shown in FIG. 16, the first portion of the via-hole electrode 13 is located within the second via-hole 12. To be specific, a conductive metal material may be deposited in the second via-hole 12 by sputtering, electron beam deposition or thermal evaporation, so as to form the first portion of the via-hole electrode 13. The first portion of the via-hole electrode 13 is in contact with the drain electrode 6.

Figure 17:
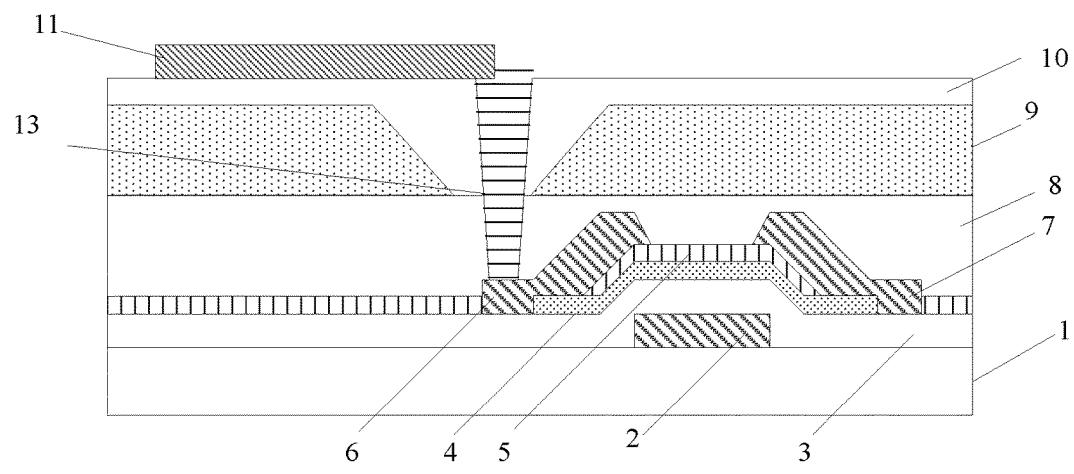
FIG. 17 is another schematic view showing the display substrate after the formation of the n-type GaN layer according to one embodiment of the present disclosure.

Step 7: forming an n-type GaN layer 11. To be specific, the n-type GaN layer 11 having a thickness of 1000-1500 nm may be formed on the AlN layer 10 through a first mask plate by low-temperature pulse magnetron sputtering, as shown in FIG. 17. The first mask plate includes an aperture corresponding to a region where the n-type GaN layer is deposited, and the target may be Si-doped or O-doped Ga. Prior to the deposition of the n-type GaN layer, the AlN layer 10 may be pre-treated with pulse plasma, so as to provide a clean surface.

Figure 18:
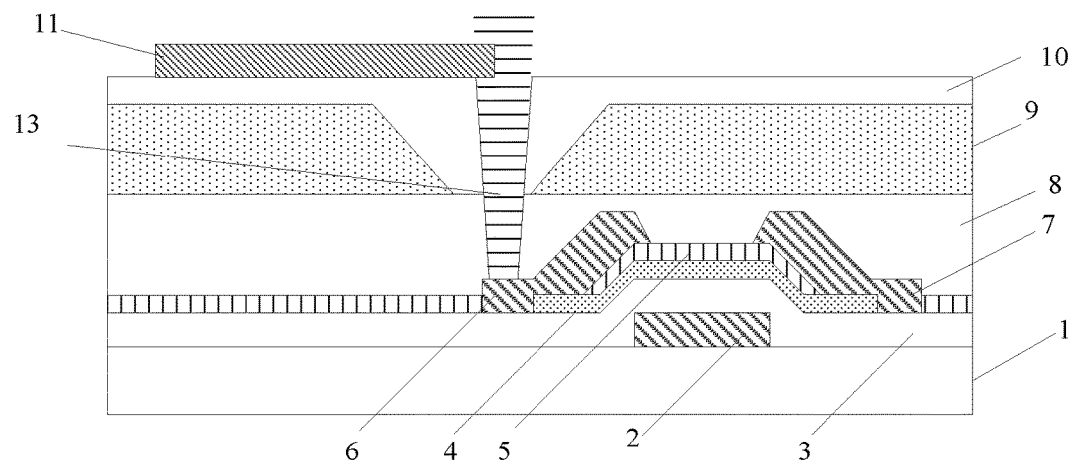
FIG. 18 is another schematic view showing the display substrate after the formation of a second portion of the electrode on the n-type GaN layer according to one embodiment of the present disclosure.

Step 8: forming a second portion of the via-hole electrode 13. As shown in FIG. 18, the second portion of the via-hole electrode 13 is located on the n-type GaN layer 11. To be specific, a conductive metal material may be deposited by sputtering, electron beam deposition or thermal evaporation, so as to form the second portion of the via-hole electrode 13. The second portion of the via-hole electrode 13 is configured to electrically connect the n-type GaN layer 11 to the drain electrode 6.

Figure 19:
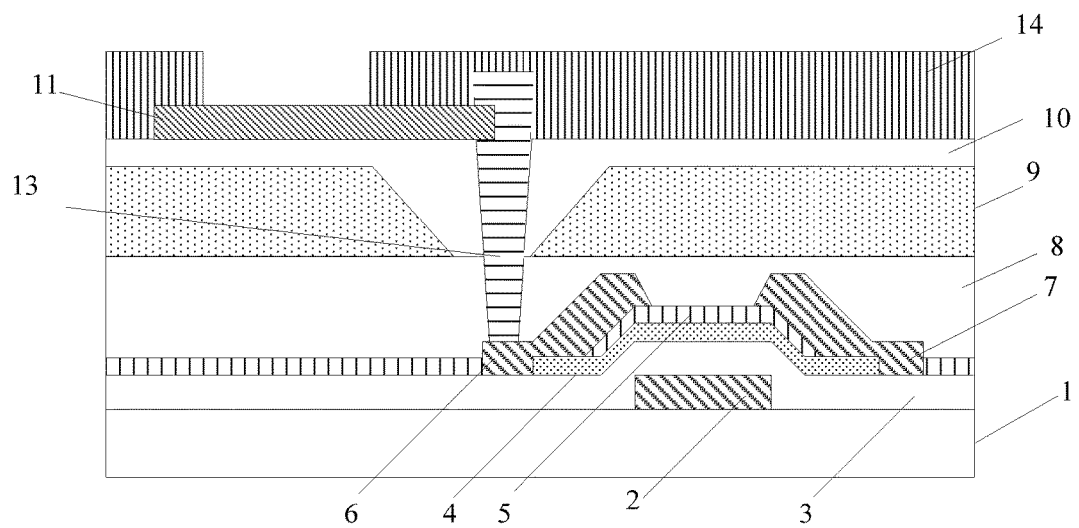
FIG. 19 is another schematic view showing the display substrate after the formation of the pixel definition layer according to one embodiment of the present disclosure.

Step 9: forming a pixel definition layer 14. Usually, a conventional pixel definition layer is made of an organic layer. However, considering a temperature for the subsequent deposition of GaN, the pixel definition layer in the embodiments of the present disclosure may be made of an inorganic material, which may include but not limited to $Al_2O_3$, $SiO_2$, AlN, TiNx, WNx or SiNx. The inorganic material may be deposited by chemical vapor deposition or pulse magnetron sputtering. In order to simplify a production device, AlN may be deposited by low-temperature pulse magnetron sputtering, so as to form the pixel definition layer 14 on the base substrate 1 obtained after Step 7 through a third mask plate, as shown in FIG. 19. The third mask plate includes an aperture corresponding to a region where the pixel definition layer 14 is deposited. A crystal structure of the pixel definition layer is not highly demanded, so the deposition temperature may be reduced appropriately. A barrier having a thickness of about 200 nm and formed by the pixel definition layer 14 may surround the n-type GaN 11, and a region surrounded by the pixel definition layer 14 is just a region where a multilayered quantum well structure is grown.

Figure 20:
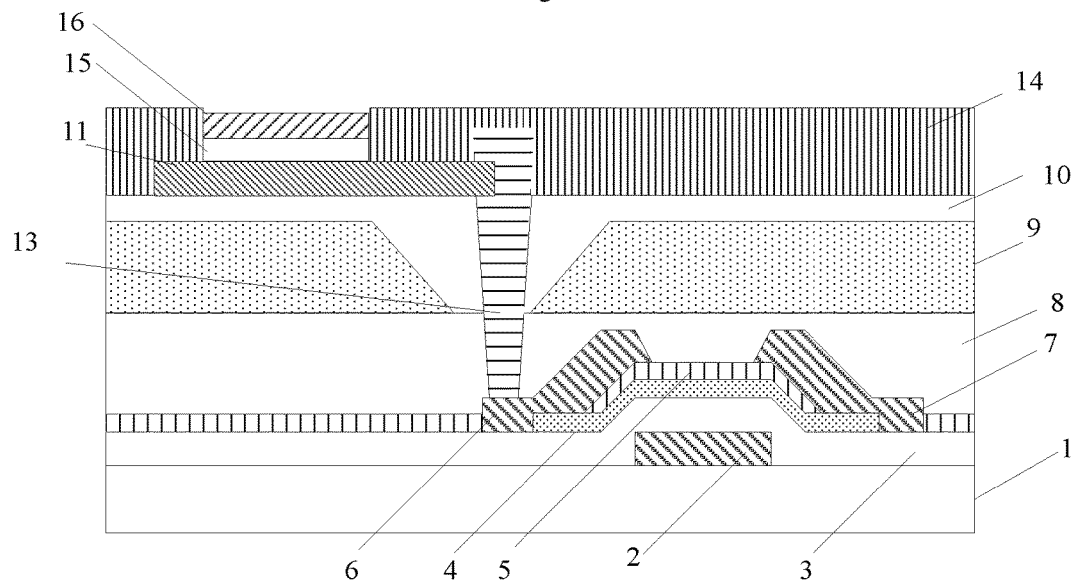
FIG. 20 is another schematic view showing the display substrate after the formation of the multilayered quantum well structure and the p-type GaN layer according to one embodiment of the present disclosure.

Step 10: forming the multilayered quantum well structure 15. To be specific, a GaN layer having a thickness of 8 to 10 nm and an InGaN layer having a thickness of 3 to 5 nm may be deposited on the n-type GaN layer 11 using undoped Ga and In-doped Ga as targets through a second mask plate by low-temperature pulse magnetron sputtering, and the deposition procedure may be repeated five times, so as to form the multilayered quantum well structure 15, as shown in FIG. 20. The second mask plate includes an aperture corresponding to a region where the multilayered quantum well structure is deposited. Prior to the deposition of the multilayered quantum well structure 15, the n-type GaN layer 11 may be pre-treated with pulse plasma, so as to provide a clean surface.

Step 11: forming a p-type GaN layer 16. To be specific, the p-type GaN layer 16 having a thickness of 500-800 nm may be formed on the multilayered quantum well structure 15 through a third mask plate by low-temperature pulse magnetron sputtering, as shown in FIG. 9. The third mask plate includes an aperture corresponding to a region where the p-type GaN layer is deposited, and Mg-doped Ga is used as the target. Prior to the deposition of the p-type GaN layer 16, the multilayered quantum well structure 15 may be pre-treated with pulse plasma so as to provide a clean surface.

Figure 21:
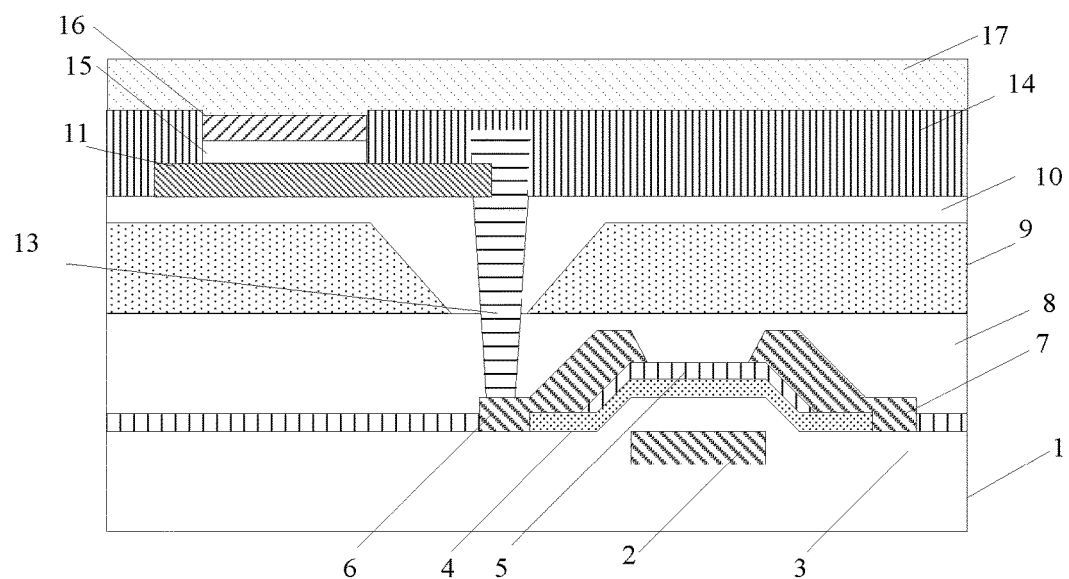
FIG. 21 is another schematic view showing the display substrate after the formation of the transparent electrode layer according to one embodiment of the present disclosure.

Step 12: forming a transparent electrode layer 17. To be specific, the transparent electrode layer 17 may be formed through a fourth mask plate using a metal evaporation device, as shown in FIG. 21. The fourth mask plate includes an aperture corresponding to a region where the transparent electrode layer 17 is deposited.

Through the above-mentioned Steps 1-12, it is able to form an active matrix GaN LED display device capable of emitting light upward.

Figure 22:
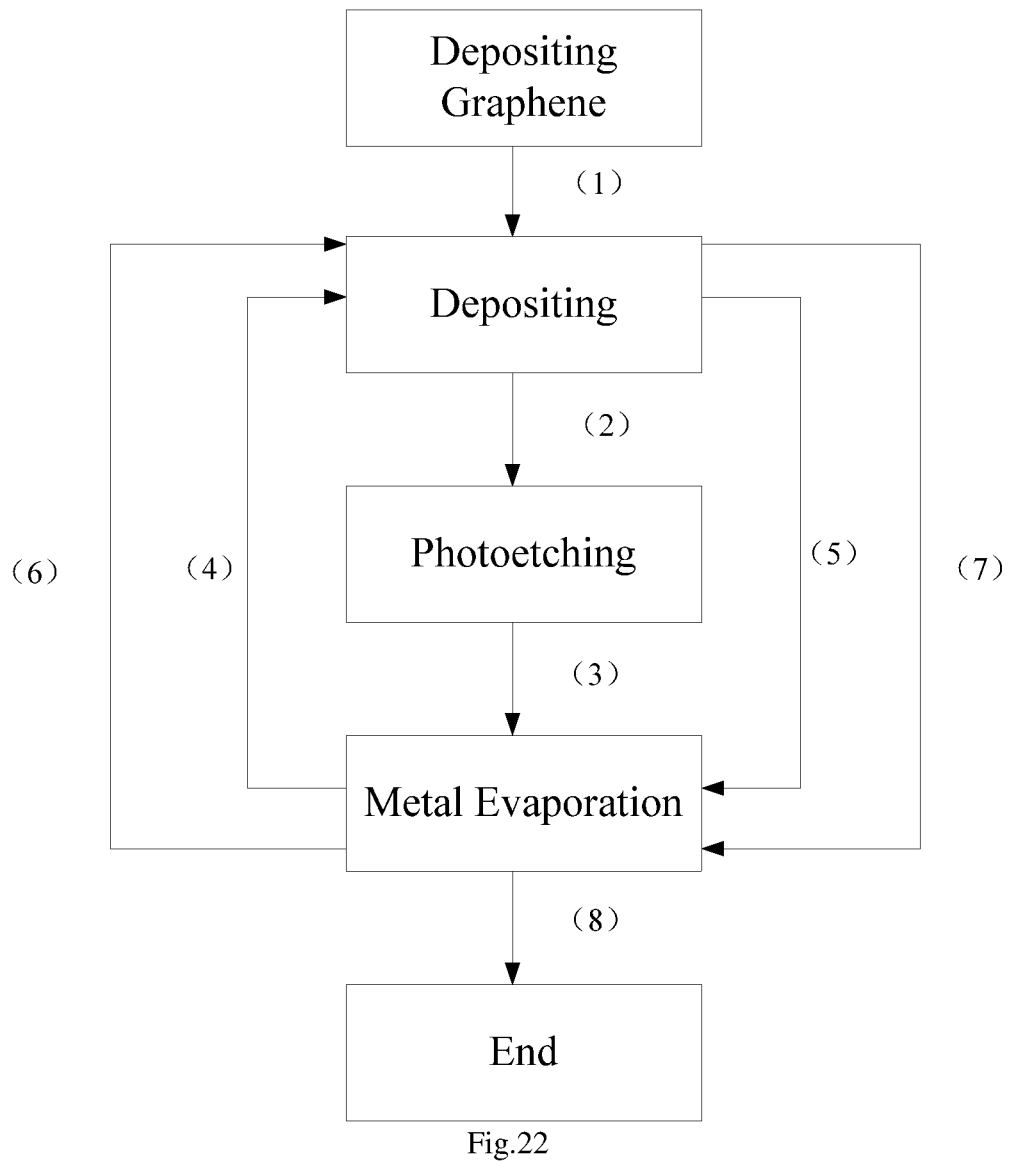
FIG. 22 is another schematic view showing a procedure for forming the LED according to one embodiment of the present disclosure.

As shown in FIG. 22 which shows a procedure for forming the LED, (1) after the transferring of the graphene layer, the base substrate enters a pulse magnetron sputtering device so as to deposit thereon the AlN layer. (2) Then, the base substrate enters an exposure device and an etcher sequentially, so as to form the second via-hole. (3) Next, the base substrate enters a metal evaporation device, so as to form the first portion of the via-hole electrode. (4) Next, the base substrate enters the pulse magnetron sputtering device so as to deposit thereon the n-type GaN layer. (5) Then, the base substrate enters the metal evaporation device again, so as to form the second portion of the via-hole electrode. (6) Next, the base substrate enters the pulse magnetron sputtering device, so as to deposit thereon the pixel definition layer, the multilayered quantum well structure and the p-type GaN layer. (7) Next, the base substrate enters the metal evaporation device again, so as to deposit thereon the transparent electrode layer. (8) Finally, the entire procedure is completed.

Figure 23:
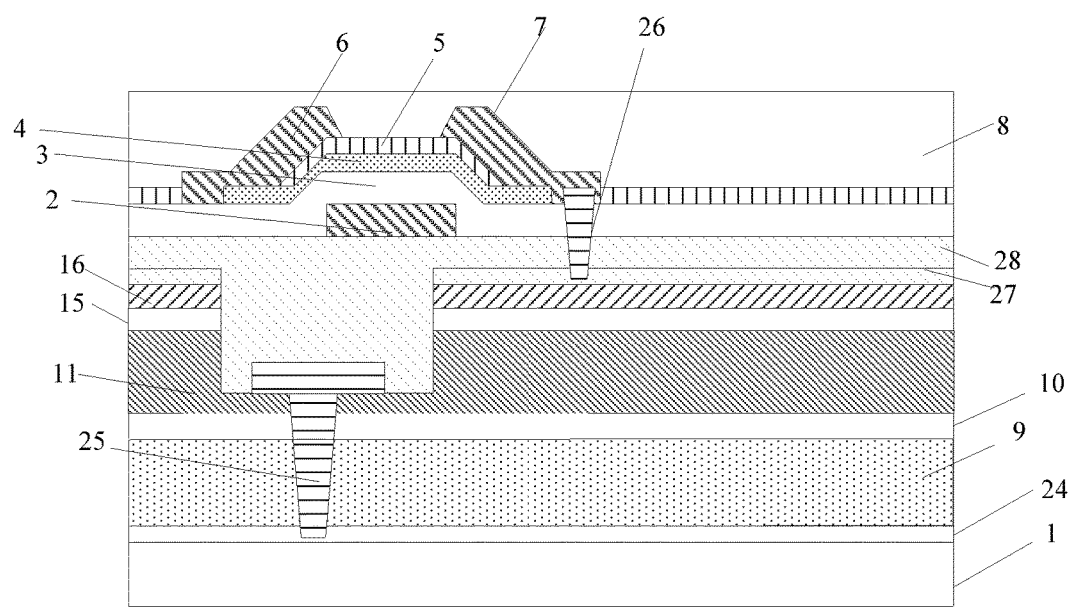
FIG. 23 is another schematic view showing the display substrate according to one embodiment of the present disclosure.

In the above two embodiments, the TFTs are formed prior to the LEDs. Of course, the LEDs may also be formed prior to the TFTs. To be specific, in an alternative embodiment, a planarization layer may be formed after the formation of the LEDs, then the TFTs may be formed on the planarization layer, and then a electrode may be formed so as to connect the p-type GaN layer of the LED and the drain electrode of the TFT. As shown in FIG. 23, the display substrate may include: a base substrate 1; a first transparent conductive layer 24 formed on the base substrate 1; a graphene layer 9 formed on the first transparent conductive layer 24; an AlN layer 10 formed on the graphene layer 9; an n-type GaN layer 11, a pixel definition layer, a multilayered quantum well structure 15, a p-type GaN layer 16 and a second transparent conductive layer 27 formed on the AlN layer 10, and a first electrode hole penetrating through the n-type GaN layer 11, the AlN layer 10 and the graphene layer 9; a first electrode 25 configured to connect the n-type GaN layer 11 to the first transparent conductive layer 24 through the first electrode hole; a planarization layer 28 formed on the base substrate 1 with the first electrode; a TFT formed on the planarization layer 28 and including a gate electrode 2, a gate insulation layer 3, a source electrode 6 and a drain electrode 7; a second electrode hole penetrating through the gate insulation layer 3 and the planarization layer 28; a second electrode 26 configured to connect the second transparent conductive layer 27 to the drain electrode 7 through the second electrode hole, thereby to connect the p-type GaN layer 16 to the drain electrode 7; and a passivation layer 8 formed on the base substrate with the second electrode.

The above are merely the preferred embodiments of the present disclosure. It should be appreciated that, a person skilled in the art may make further modifications and improvements without departing from the principle of the present disclosure, and these modifications and improvements shall also fall within the scope the present disclosure.

What is claimed is:

1. A method for manufacturing a display substrate, comprising a step of forming a plurality of thin film transistors (TFTs), wherein the method further comprises steps of:
    forming a lattice matching layer on a substrate so as to deposit aluminum nitride (AlN) on the lattice matching layer;
    depositing an AlN layer on the lattice matching layer by low-temperature pulse magnetron sputtering; and
    forming on the AlN layer gallium nitride (GaN) light-emitting diodes (LEDs) each including an n-type GaN layer, a multilayered quantum well structure and a p-type GaN layer and corresponding to one of the TFTs,
    wherein the lattice matching layer is a graphene layer;
    wherein the step of forming the plurality of TFTs comprises:
        providing a base substrate;
        forming a TFT including a gate electrode, a source electrode and a drain electrode on the base substrate; and
        forming a passivation layer having a surface roughness not greater than a predetermined value on the base substrate with the TFT,
    the step of forming the lattice matching layer on the substrate comprises:
        forming the graphene layer including a first via-hole on the passivation layer,
    the step of depositing the AlN layer on the lattice matching layer by low-temperature pulse magnetron sputtering comprises:
        depositing the AlN layer on the graphene layer by low-temperature pulse magnetron sputtering, and
    the step of forming on the AlN layer the GaN LEDs each including the n-type GaN layer, the multilayered quantum well structure and the p-type GaN layer comprises:
        forming the n-type GaN layer on the AlN layer, and forming a second via-hole penetrating through the passivation layer, the AlN layer and the n-type GaN layer and located in the first via-hole;
        forming a via-hole electrode configured to connect the n-type GaN layer to the drain electrode through the second via-hole; and
        forming a pixel definition layer, the multilayered quantum well structure, the p-type GaN layer and a transparent electrode layer.

2. The method according to claim 1, wherein prior to the step of depositing the AlN layer on the lattice matching layer by low-temperature pulse magnetron sputtering, the method further comprises:
    subjecting the graphene layer to heat treatment in vacuum or nitrogen at a temperature of 500 to 600° C.

3. The method according to claim 1, wherein the step of forming the graphene layer including the first via-hole on the passivation layer comprises:
    depositing single-layered or multilayered graphene on a copper foil, laminating the graphene layer on the copper foil onto the base substrate with the passivation layer so as to attach the graphene layer onto the passivation layer, and etching off the copper foil by an etchant, so as to form the graphene layer including the first via-hole by plasma etching; or
    depositing single-layered or multilayered graphene onto the copper foil, patterning the graphene layer by plasma etching, and transferring the patterned graphene layer onto the base substrate with the passivation layer, so as to form the graphene layer including the first via-hole on the passivation layer; or
    etching the copper foil with the etchant to pattern the copper foil, depositing single-layered or multilayered graphene onto the patterned copper foil, and transferring the graphene layer on the patterned copper foil onto the base substrate with the passivation layer, so as to form the graphene layer including the first via-hole on the passivation layer.

4. The method according to claim 1, wherein the step of depositing the AlN layer on the lattice matching layer by low-temperature pulse magnetron sputtering comprises:
    sputtering an Al target with a bipolar pulse in a working gas at a temperature of 500 to 600° C. and at a pressure of 0.3 to 0.6 Pa, so as to form the AlN layer having a thickness of 30 to 100 nm, wherein the pulse has a frequency of 10 to 100 kHz, a duration of an on-state signal is $\frac{1}{10}$ to $\frac{1}{2}$ of a duration of an off-state signal, the working gas is a mixture of $N_2$ and Ar, or $NH_3$ and Ar, and a deposition rate is 500 to 3000 nm/h.

5. The method according to claim 1, wherein the step of forming the n-type GaN layer comprises:
    forming the n-type GaN having a thickness of 1000 to 1500 nm on the AlN layer through a first mask plate by low-temperature pulse magnetron sputtering,
    wherein the first mask plate comprises an aperture corresponding to a region where the n-type GaN layer is deposited, and a target is Ga doped with Si or O.

6. The method according to claim 1, wherein the step of forming the multilayered quantum well structure comprises:
    depositing sequentially a GaN layer having a thickness of 8 to 10 nm and an indium gallium nitride (InGaN) layer having a thickness of 3 to 5 nm on the n-type GaN layer using undoped Ga and In-doped Ga as targets through a second mask plate by low-temperature pulse magnetron sputtering, and repeating the deposition procedure five times, so as to form the multilayered quantum well structure,
    wherein the second mask plate comprises an aperture corresponding to a region where the multilayered quantum well structure is deposited.

7. The method according to claim 1, wherein the step of forming the p-type GaN layer comprises:
forming the p-type GaN layer having a thickness of 500 to 800 nm on the multilayered quantum well structure through a third mask plate by low-temperature pulse magnetron sputtering,
wherein the third mask plate comprises an aperture corresponding to a region where the p-type GaN layer is deposited, and a target is Mg-doped Ga.

8. The method according to claim 1, wherein the substrate is a glass substrate.

9. A method for manufacturing a display substrate, comprising a step of forming a plurality of thin film transistors (TFTs), wherein the method further comprises steps of:
forming a lattice matching layer on a substrate so as to deposit aluminum nitride (AlN) on the lattice matching layer;
depositing an AlN layer on the lattice matching layer by low-temperature pulse magnetron sputtering; and
forming on the AlN layer gallium nitride (GaN) light-emitting diodes (LEDs) each including an n-type GaN layer, a multilayered quantum well structure and a p-type GaN layer and corresponding to one of the TFTs,
wherein the lattice matching layer is a graphene layer;
wherein the step of forming the lattice matching layer on the substrate comprising:
providing a base substrate;
depositing a first transparent conductive layer on the base substrate; and
forming the graphene layer on the first transparent conductive layer,
the step of depositing the AlN layer on the lattice matching layer by low-temperature pulse magnetron sputtering comprises:
depositing the AlN layer onto the graphene layer by low-temperature pulse magnetron sputtering,
the step of forming on the AlN layer the GaN LEDs each including the n-type GaN layer, the multilayered quantum well structure and the p-type GaN layer comprises:
forming the n-type GaN layer, a pixel definition layer, the multilayered quantum well structure, the p-type GaN layer and a second transparent conductive layer sequentially on the AlN layer;
etching the pixel definition layer, the multilayered quantum well structure, the p-type GaN layer and the second transparent conductive layer at a channel region, so as to expose the n-type GaN layer at the channel region;
etching the n-type GaN layer, the AlN layer and the graphene layer at the channel region, so as to form a first electrode hole penetrating through the n-type GaN layer, the AlN layer and the graphene layer; and
forming a first electrode configured to connect the n-type GaN layer to the first transparent conductive layer through the first electrode hole, and
the step of forming the plurality of TFTs comprises:
forming a planarization layer, and forming the TFT including a gate electrode, a gate insulation layer, a source electrode and a drain electrode on the planarization layer;
forming a second electrode hole penetrating through the gate insulation layer and the planarization layer;
forming a second electrode configured to connect the p-type GaN layer to the drain electrode through the second electrode hole; and
forming a passivation layer.

10. The method according to claim 9, wherein the step of forming the graphene layer on the first transparent conductive layer comprises:
depositing single-layered or multilayered graphene onto a copper foil, laminating the graphene layer on the copper foil onto the base substrate with the first transparent conductive layer so as to attach the graphene layer onto the first transparent conductive layer, and etching off the copper foil by an etchant; or
depositing single-layered or multilayered graphene onto the copper foil, and transferring the graphene layer onto the base substrate with the first transparent conductive layer, so as to form the graphene layer on the first transparent conductive layer.

11. The method according to claim 9, wherein the step of forming the n-type GaN layer comprises:
forming the n-type GaN having a thickness of 1000 to 1500 nm on the AlN layer through a first mask plate by low-temperature pulse magnetron sputtering,
wherein the first mask plate comprises an aperture corresponding to a region where the n-type GaN layer is deposited, and a target is Ga doped with Si or O.

12. The method according to claim 9, wherein the step of forming the multilayered quantum well structure comprises:
depositing sequentially a GaN layer having a thickness of 8 to 10 nm and an InGaN layer having a thickness of 3 to 5 nm on the n-type GaN layer using undoped Ga and In-doped Ga as targets through a second mask plate by low-temperature pulse magnetron sputtering, and repeating the deposition procedure five times, so as to form the multilayered quantum well structure,
wherein the second mask plate comprises an aperture corresponding to a region where the multilayered quantum well structure is deposited.

13. The method according to claim 10, wherein the step of forming the p-type GaN layer comprises:
forming the p-type GaN layer having a thickness of 500 to 800 nm on the multilayered quantum well structure through a third mask plate by low-temperature pulse magnetron sputtering,
wherein the third mask plate comprises an aperture corresponding to a region where the p-type GaN layer is deposited, and a target is Mg-doped Ga.

14. The method according to claim 9, wherein prior to the step of depositing the AlN layer on the lattice matching layer by low-temperature pulse magnetron sputtering, the method further comprises:
subjecting the graphene layer to heat treatment in vacuum or nitrogen at a temperature of 500 to 600° C.

15. The method according to claim 9, wherein the substrate is a glass substrate.

* * * * *